United States Patent
Yochum

(10) Patent No.: US 6,567,294 B1
(45) Date of Patent: May 20, 2003

(54) LOW POWER PRE-CHARGE HIGH ROM ARRAY

(75) Inventor: John A. Yochum, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/075,882

(22) Filed: Feb. 13, 2002

(51) Int. Cl.$^7$ .............................. G11C 17/00; G11C 7/00
(52) U.S. Cl. ........................................ 365/104; 365/203
(58) Field of Search ........................... 365/94, 104, 203, 365/230.03, 230.06

(56) References Cited

U.S. PATENT DOCUMENTS

| | | | | |
|---|---|---|---|---|
| 5,061,980 A | * | 10/1991 | Uchida | 365/230.03 |
| 5,373,480 A | * | 12/1994 | Kudou | 365/230.03 |
| 5,440,506 A | * | 8/1995 | Longway et al. | 365/203 |
| 5,926,425 A | * | 7/1999 | Morimoto | 365/203 |
| 6,075,734 A | * | 6/2000 | Jang | 365/203 |
| 6,198,678 B1 | * | 3/2001 | Albon et al. | 365/203 |
| 6,282,136 B1 | * | 8/2001 | Sakurai et al. | 365/203 |

OTHER PUBLICATIONS

Charles A. Zukowski and Shao–Yi Wang, "Use of Selective Precharge for Low–Power Content–Addressable Memories", 1997 IEEE International Symposium on Circuits and Systems, Jun. 9–12, 1997, Hong Kong, pp. 1788–1791.

Jan M. Rabaey, "Digital Integrated Circuits/ A Design Perspective—Semiconductor Memories", Prentice–Hall (1995), at http://infopad.eecs.berkeley.edu/~icdesign/slides/slides10.pdf, printed Feb. 5, 2002.

* cited by examiner

Primary Examiner—Trong Phan

(57) ABSTRACT

A read-only memory system for reduced power consumption during a read operation is described, as is a method for performing a read operation with such a read-only memory system. Rather than pre-charging all column lines in a ROM array, only W column lines are pre-charged to read a word of length W. Each column line in the ROM array has a switching mechanism which can connect the column line to a pre-charge voltage when a signal is sent to the switching mechanism from an address bus. After W column lines are pre-charged, a voltage is provided to corresponding row lines. The voltages of the W column lines are subsequently detected in order to read the content of the W bits comprising the word.

12 Claims, 3 Drawing Sheets

LOW POWER PRE-CHARGE HIGH ROM ARRAY

FIELD OF THE INVENTION

The present invention relates to the field of integrated circuit memories, specifically, to a method and apparatus for conserving power in a pre-charge high read-only memory (ROM) array.

BACKGROUND

Read-only memory (ROM) is non-volatile memory that may be read but not written to. In a conventional ROM array, memory cells are arrayed in rows and columns. Each memory cell is associated with one row line and one column line. Just prior to reading one or more memory cells in the array, all column lines in the array are typically pre-charged high; that is, a voltage corresponding to a logical 1 is provided to the column lines.

FIG. 1 shows a slice 10 of a ROM array according to the prior art. For a ROM array with a word length W, slice 10 of FIG. 1 would be repeated W times. For example, for an 8-bit word length, the ROM array would include eight slices such as slice 10, including eight N-to-1 multiplexers 200 that each output the value of one bit of the 8-bit word onto a bit output such as bit output 210 of FIG. 1.

Memory cells $C_{11}$ through $C_{MN}$ are associated with row lines 50-1 through 50-M and column lines 60-1 through 60-N. For example, memory cell $C_{11}$ is associated with row line 50-1 and column line 60-1. During the fabrication of slice 10, memory cells $C_{11}$ through $C_{MN}$ are programmed to output a logical 1 or a logical 0. The content of a memory cell may be read by providing signals to its associated row lines and column lines.

In order to read one of the memory cells such as cell $C_{11}$, column lines 60-1 through 60-N are first pre-charged high. In order to pre-charge the column lines, a pre-charge signal is asserted low to the gate of PFET pull-up transistors 100-1 through 100-N, turning on the transistors. A voltage supply, $V_{DD}$, coupled to the source of transistors 100-1 through 100-N, pre-charges each selected column line to a pre-charge voltage corresponding to a logical 1 through the connection to the drain of the transistor. The pre-charge voltage may be approximately 3.3 volts. The transistors 100-1 through 100-N are then turned off by asserting the pre-charge signal high. The column lines remain charged high, but are no longer connected to source voltage supply $V_{DD}$.

Next, a voltage corresponding to a logical 1 is applied to one of the row lines 50-1 through 50-M. For example, if the bit stored in memory cell $C_{11}$ is part of the word being read, a voltage is applied to row line 50-1 after column lines 60-1 through 60-N have been pre-charged high. If cell $C_{11}$ has been programmed to output a logical 0, the voltage of the column line 60-1 is discharged. On the other hand, if cell $C_{11}$ has been programmed to output a logical 1, the voltage of column line 60-1 is not discharged. The output of column lines 60-1 through 60-N are input to N to 1 multiplexer 200. Multiplexer 200 outputs a voltage corresponding to the value of the chosen cell on bit output 210.

One drawback to the prior art system is that all column lines in the ROM array are pre-charged, regardless of the length of the word to be read. For battery-operated and other power-sensitive devices, pre-charging all column lines is not efficient.

Therefore, it is desirable to provide a read-only memory system and method of using the system that does not require pre-charging all column lines.

SUMMARY

In order to conserve power in a ROM array using a pre-charge high, pull-down low scheme, switches are placed between the pre-charge high stage and the memory array. Therefore, for a word of length W, only W column lines are pre-charged, rather than all of the column lines in the ROM array.

According to an embodiment of the invention, a read-only memory system includes a ROM array with memory cells arranged in multiple columns and multiple rows. The ROM array includes a plurality of memory cells, each of which is programmed with one bit of data. For example, a memory cell may be programmed as a logical 1 or a logical 0. Each memory cell is associated with one column line and one row line so that its content may be read.

The read-only memory system includes a switching mechanism for each column line in the memory array, and an address system. The switch couples or decouples a first portion of the column line coupled memory cells in the array and a second portion of the column line coupled to a pre-charge voltage supply. For simplicity, the first portion of the column line may be referred to as the column line, while the second portion of the column line may be referred to as the pre-charge line. The address system includes an address bus to provide address information to address gates associated with the column lines. A signal from an address gate closes its corresponding switch, coupling the selected column line to its pre-charge line and subsequently pre-charging the column line. According to an embodiment, the switching mechanism is a full transmission gate, although other types of switches are also suitable. A high signal from the address gate turns on the full transmission gate, coupling the column line to its associated pre-charge line. A pre-charge voltage is then coupled to each selected column line through the corresponding pre-charge lines. If the input of the full transmission gate is not high, the column line is de-coupled from its associated pre-charge line and therefore is not coupled to the pre-charge voltage.

The read-only memory system includes a pre-charge system for providing a pre-charge voltage to selected column lines through associated pre-charge lines. The pre-charge system includes a pull-up transistor, whose source is connected to a source voltage supply. When the pull-up transistor is turned on, the pre-charge line is coupled to the voltage supply through the drain of the pull-up transistor. When the switch couples the pre-charge line to its associated column line, the column line is pre-charged by the source voltage supply.

The read-only memory system includes one or more multiplexers. The input terminals of each multiplexer are connected to the pre-charge lines associated with each of the column lines. Each multiplexer has one or more output terminals. When a word of data is being read, each output corresponds to the value of one of the bits comprising the word. According to an embodiment of the invention, there are W multiplexers to read a word of length W. Each multiplexer has a plurality of input terminals, and each multiplexer outputs one bit of the word. The multiplexer may be a simple AND gate, where the inputs corresponding to the column lines that are not associated with a bit in the word to be read are high, while the input corresponding to the column line that is associated with a bit to be read is high if the bit is a 1 and low if the bit is a 0.

According to an embodiment of the invention, a read operation may be performed using a memory system as described above. In order to read a word of length W, an address bus first sends a signal to each of the W address gates corresponding to the W column lines associated with a bit to be read. The output of the address gates is input to the corresponding switching mechanism, coupling the column line to its associated pre-charge line only when the column line includes a bit to be read. According to an embodiment of the invention, the address gates are AND gates, and the inputs of the AND gate are both high to select the corresponding column line for precharging. The column line is selected by providing the address gate output to the input of the full transmission gate, which acts as a closed switch when its input is high. The selected column line is thereby connected to the pre-charge voltage through the pre-charge line when the input of the full transmission gate is high.

After the full transmission gate connects each selected column line to the associated pre-charge line, a pre-charge signal is provided, coupling the selected column lines to a pre-charge voltage supply. The pre-charge signal is then turned off, leaving the column lines at the pre-charge voltage but de-coupling the column lines from the pre-charge voltage supply. In an embodiment of the invention, a voltage supply $V_{DD}$ provides a voltage to the source of the pull-up transistor. A pre-charge signal is provided to the gate of the pull-up transistor, turning it on and pre-charging selected column lines through their corresponding pre-charge lines, which are coupled to the drain of the transistor. After the selected column lines are pre-charged, the pre-charge signal is turned off. The selected column lines remain coupled to the drain of the pull-up transistor through the pre-charge line, but are no longer connected to the source voltage supply.

Next, a voltage is applied to selected row lines, corresponding to memory cells whose content is to be read. The voltage of the associated column lines containing a memory cell that is programmed as a logical 1 remains high. However, the voltage of the associated column lines containing a memory cell that is programmed as a logical 0 is discharged.

The voltage of each selected column line is detected, in order to read the value of each bit in the word. According to an embodiment of the invention, the voltage of each selected column line is coupled to an input terminal of a multiplexer through its associated pre-charge line. The multiplexer output corresponds to the value of one or more bits in the word being read. Multiple multiplexers may be used, where each outputs less than W bits of the word.

A more complete understanding of embodiments of the present invention will be afforded to those skilled in the art, as well as a realization of additional advantages thereof, by a consideration of the following detailed description of one or more embodiments. Reference will be made to the appended drawing that will first be described briefly.

BRIEF DESCRIPTION OF THE DRAWING

Use of the same or similar reference numbers in different figures indicates the same or like elements.

DETAILED DESCRIPTION

According to an embodiment of the invention, a read-only memory system pre-charges only W column lines of a ROM array in order to read a word of length W. Embodiments of the read-only memory system include transistors and logic elements that use voltages referred to herein as "high" or "low." They may also be referred to as logical 1s or logical 0s. In each case, the actual value of the voltage used depends on the actual structure used. For one typical structure, a "high" voltage, or a logical 1, refers to a voltage of about 3.3 volts, and a "low" voltage, or a logical 0, refers to a voltage of about 0 volts.

Additionally, embodiments of the read-only memory system use particular types of transistors, logic elements, and other devices such as buses. However, persons skilled in sort of memory systems understand that alternate configurations may be used in order to pre-charge only W column lines to read a word of word length W. Such alternate configurations are within the scope of the present invention.

Figure 1:
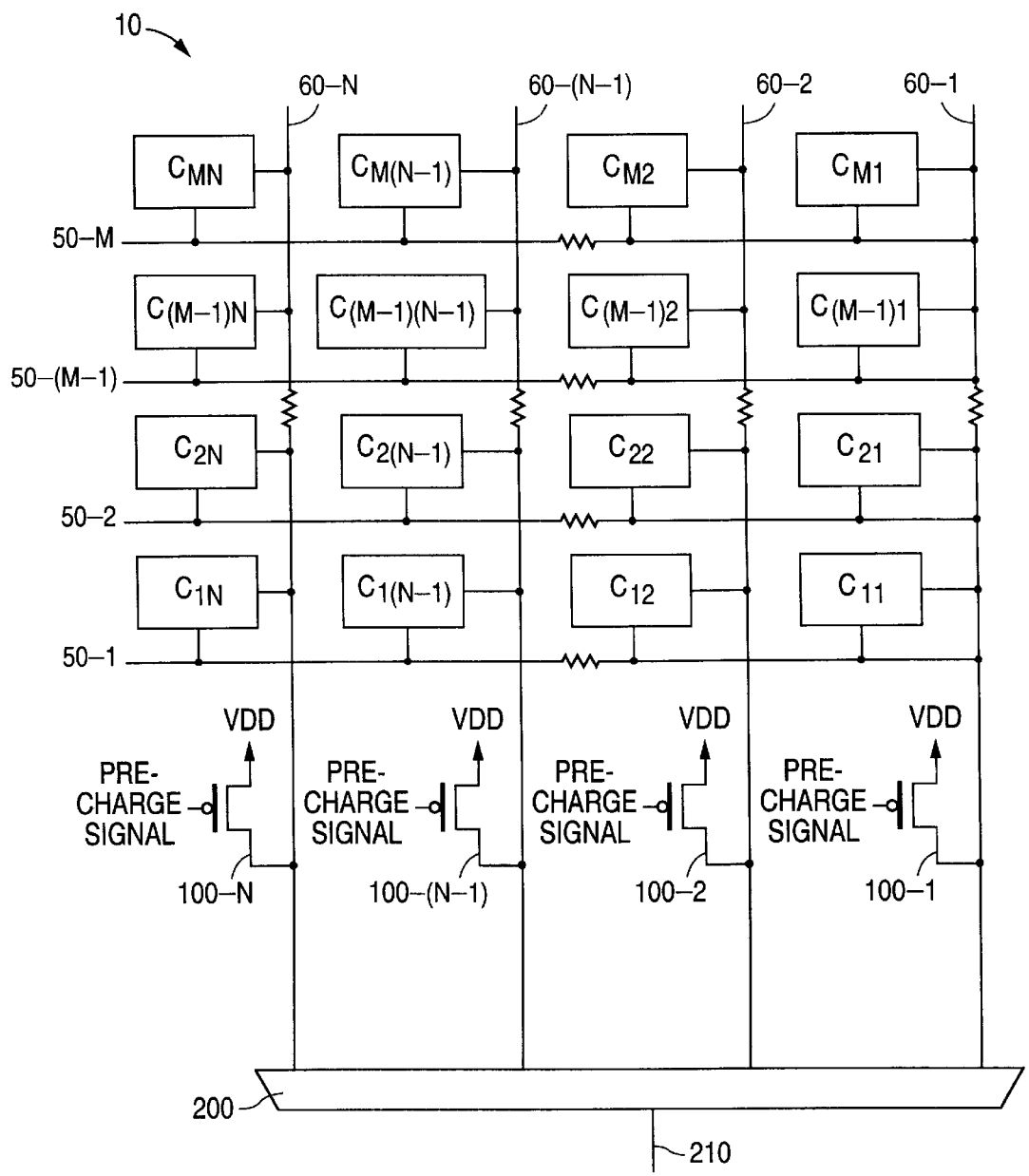
FIG. 1 shows part of a memory system, including an N-column, M-row slice of a memory cell array according to the prior art.
Figure 2:
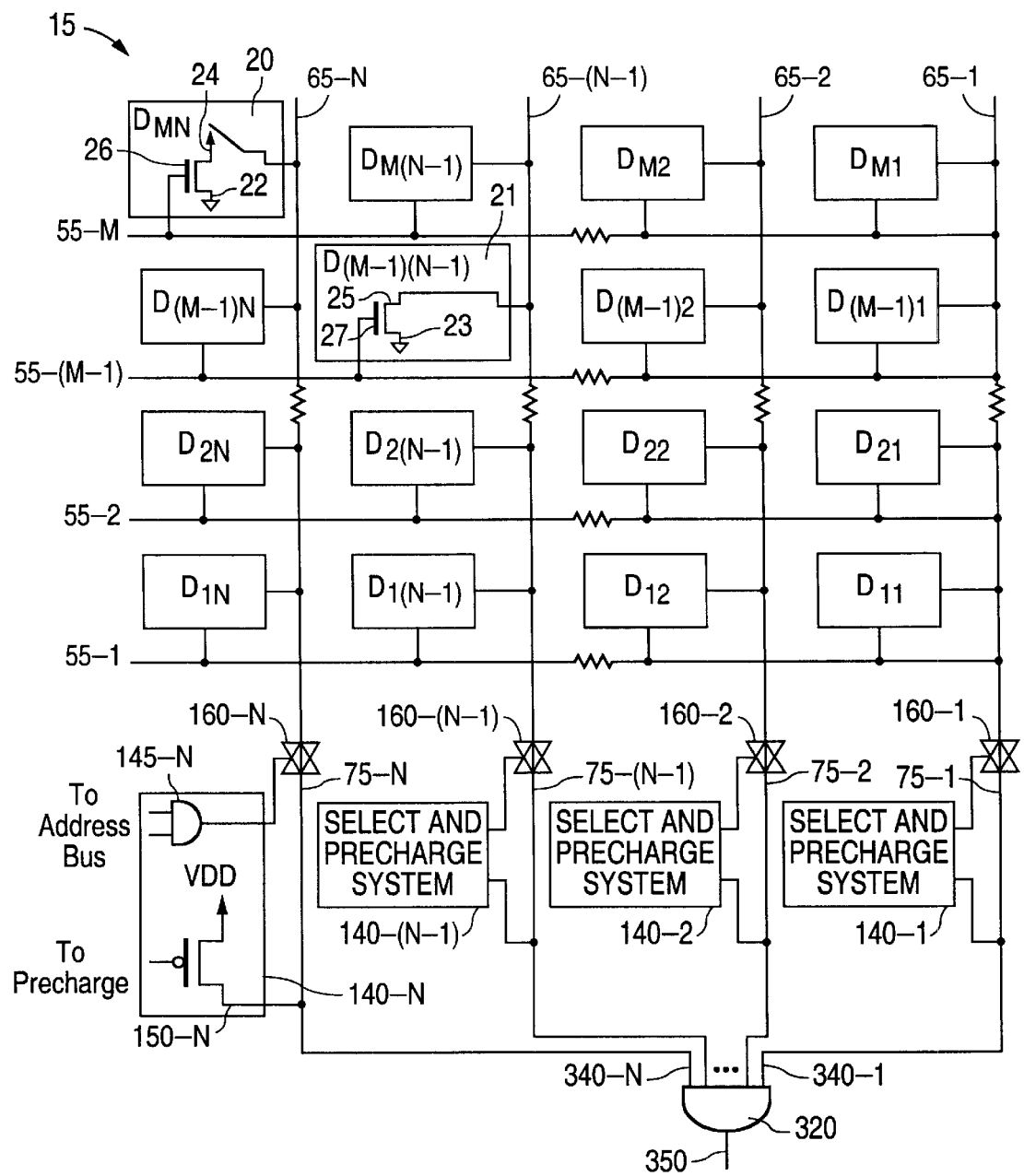
FIG. 2 shows part of a memory system, including an N-column, M-row slice of a memory cell array for reduced power consumption, according to an embodiment of the invention.

FIG. 2 shows a slice 15 of a memory system that may be used with an embodiment of the invention. For a ROM array with a word length W, slice 15 of FIG. 2 would be repeated W times. For example, for an 8-bit word length, the ROM array would include eight slices such as slice 15, including eight N-to-1 multiplexers such as N-input AND gate 320. When a read operation is performed, each multiplexer outputs the value of one bit of the 8-bit word onto a bit output terminal such as bit output terminal 350 of FIG. 2.

Slice 15 includes memory cells $D_{11}$ through $D_{MN}$. Each memory cell is associated with a column line and a row line. For example, cell $D_{MN}$ is associated with a row line 55-M and a column line 65-N. Each memory cell in the ROM array is programmed as either a 1 or a 0. Embodiments of the invention may use any type of ROM memory cell. Memory cells $D_{MN}$ and $D_{(M-1)(N-1)}$ of FIG. 2 show one possible type of ROM memory cell that may be used. Memory cell $D_{MN}$ is programmed as a logical 1, while memory cell $D_{(M-1)(N-1)}$ is programmed as a logical 0.

Memory cell $D_{MN}$ includes a FET 20 with a source 22, a drain 24, and a gate 26. During the fabrication of slice 15, drain 24 is not connected to column line 65-N. To read the content of memory cell $D_{MN}$, column line 65-N is first coupled to a pre-charge line 75-N by asserting the input of a full transmission gate 160-N high. A pre-charge signal asserted low to the gate of a pull-up PFET 150-N turns on the transistor and couples column line 65-N to the source voltage supply $V_{DD}$ through pre-charge line 75-N, thereby pre-charging column line 65-N. The pre-charge signal is then asserted high, turning the transistor off and de-coupling the source voltage supply from column line 65-N.

A voltage is then applied to row line 55-M, which is connected to gate 26, turning on FET 20. However, since column line 65-N is not connected to drain 24, the voltage of column line 65-N is not discharged to ground through source 22. The voltage of column line 65-N and pre-charge line 75-N remains high, since memory cell $D_{MN}$ is programmed as a logical 1.

In contrast, memory cell $D_{(M-1)(N-1)}$ is programmed as a logical 0. Memory cell $D_{(M-1)(N-1)}$ includes a FET 21 with a source 23, a drain 25, and a gate 27, and is associated with a row line 55-(M−1) and a column line 65-(N−1). During the fabrication of slice 15, drain 25 is connected to column line 65-(N−1). To read the content of memory cell $D_{(M-1)(N-1)}$, column line 65-(N–1) is first coupled to a pre-charge line 75-(N–1) by asserting the input of a full transmission gate 160-(N–1) high. A pre-charge signal asserted low to the gate of a pull-up PFET in select and pre-charge system 140-(N–1) turns on the transistor and couples column line 65-(N–1) to the source voltage supply $V_{DD}$ through pre-charge line 75-(N–1), thereby pre-charging column line 65-(N–1). The pre-charge signal is then asserted high, turning the transistor off and de-coupling the source voltage supply from column line 65-(N–1).

A voltage is then applied to row line 55-(M–1), which is connected to gate 27, turning on FET 21. Since column line 65-(N–1) is connected to drain 25, the voltage of column line 65-(N–1) is therefore discharged to ground through source 23. The voltage of column line 65-(N–1) and pre-charge line 75-(N–1) is therefore pulled down low, corresponding to a bit value of 0 stored in memory cell $D_{(M-1)(N-1)}$.

According to an embodiment of the invention, a read-only memory system for pre-charging only W columns in a memory cell array includes W slices such as slice 15. Each slice includes multiple column lines, such as column lines 65-1 through 65-N of FIG. 2. Each slice includes multiple row lines, such as row lines 55-1 through 55-M of FIG. 2. Each column line is connected to a switching mechanism, so that the column line may be coupled to a pre-charge system through a pre-charge line if the column line is selected for pre-charging. Each switching mechanism has an input terminal coupled to the output terminal of an address gate, so that if the associated column line is selected for pre-charging, the output of the address gate causes the switching mechanism to couple the column line to its pre-charge line.

According to an embodiment of the invention, the switching mechanism for column line 65-N of FIG. 2 is a full transmission gate 160-N. Column line 65-N may be pre-charged high by asserting the input of full transmission gate 160-N high, thereby closing the switch, and then providing a pre-charge voltage through the drain of pull-up PFET 150-N. However, if the input to full transmission gate 160-N is low, the switch is open and column line 65-N is not coupled to pre-charge line 75-N. Therefore, if the input to full transmission gate 160-N is low, column line 65-N is not pre-charged.

According to an embodiment of the invention, for each column line in the read-only memory system, there is a select and pre-charge system such as select and pre-charge system 140-N for column line 65-N of FIG. 2. Select and pre-charge system 140-N includes an address select gate 145-N and pull-up PFET 150-N. Address select gate 145-N is an AND gate in one embodiment. However, other types of address select circuitry are also suitable. An address bus (not shown) provides an address signal to the select and pre-charge systems. For example, if column line 65-N is selected for pre-charging, an address bus asserts both inputs of AND address select gate 145-N high, making its output high. The output of address select gate 145-N is input to full transmission gate 160-N, closing the switch and coupling column line 65-N to pre-charge line 75-N for pre-charging.

After selected columns are coupled to their respective pre-charge lines, a pre-charge voltage is provided by the select and pre-charge system. According to an embodiment of the invention, each select and pre-charge system includes a pull-up PFET, with the drain of the PFET coupled to the associated pre-charge line and the source of the pull-up FET coupled to a source voltage supply, $V_{DD}$. A pre-charge signal asserts the gate of each pull-up PFET low, turning on the transistor and coupling the pre-charge line to the source voltage supply. Since those column lines that are selected for pre-charging are coupled to their respective pre-charge lines, the selected column lines are thus pre-charged. After the selected columns are pre-charged, the pre-charge signal is asserted high, turning off the pull-up PFET and de-coupling the pre-charge lines from the source voltage supply. Subsequently, the address bus provides a signal for charging the row lines associated with the W memory cells to be read. Such systems for providing a voltage to row lines for reading the content of memory cells are conventional and known to those skilled in the art.

The read-only memory system further includes one or more multiplexers such as AND gate 320 of FIG. 2. AND gate 320 has N input terminals 340-1 to 340-N for the pre-charge lines 75-1 through 75-N, corresponding to column lines 65-1 through 65-N. Additionally, AND gate 320 has a 1-bit output terminal 350, which provides the value of the memory cell being read to an output bus (not shown). According to an embodiment of the invention, for W slices like slice 15, there are a total of W multiplexers, where each of the W multiplexers has N input terminals and one output terminal. The voltage of each of the input terminals 340-1 to 340-N is high after the pre-charge signal couples the source voltage supply $V_{DD}$ to the pre-charge lines. The voltage of the pre-charge lines corresponding to non-selected column lines remains high during the read operation. However, the voltage of the pre-charge line corresponding to the selected column will remain high if the bit stored in the memory cell being read is a 1, while it will be pulled down low if the bit stored in the memory cell being read is a 0.

Figure 3:
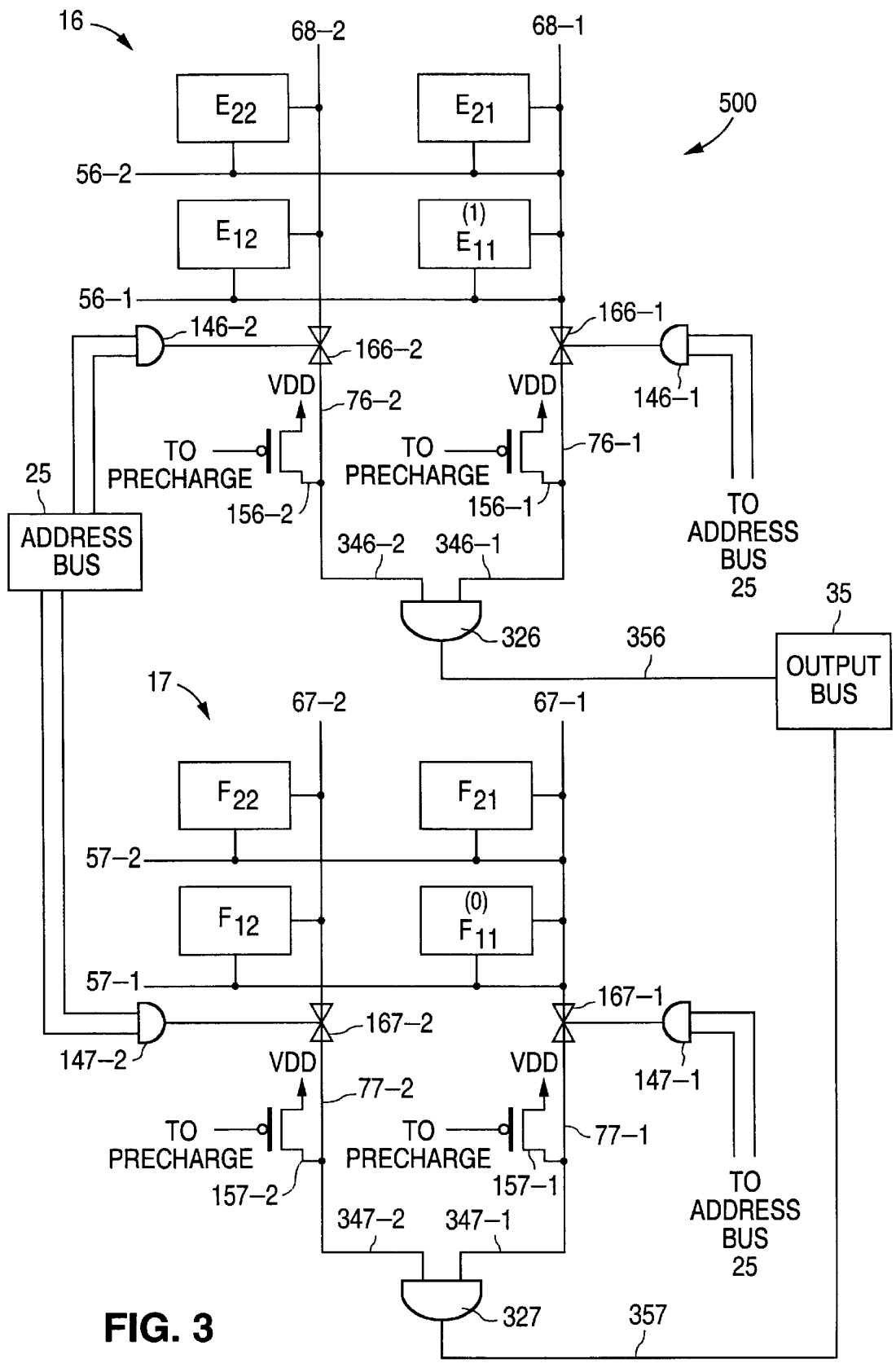
FIG. 3 shows a memory system including two 2-column, 2-row slices such as those shown in FIG. 2 for reading a two bit word, according to an embodiment of the invention.

FIG. 3 illustrates a read-only memory system 500 with a 2-bit word length (W=2) and a total of four column lines in two slices, according to an embodiment of the invention. Slice 16 and slice 17 of FIG. 3 are similar to slice 15 of FIG. 2, with two row lines (M=2) and two column lines (N=2) for each slice. In order to read a word consisting of the bits stored in memory cell $E_{11}$ and $F_{11}$, the following process may be used.

At the beginning of a read operation, an address bus 25 outputs signals to address gate 146-1 and address gate 147-1, selecting column lines 66-1 and 67-1, respectively, for pre-charging. As a result, the output of address gates 146-1 are 147-1 are high. The high output terminals of address gates 146-1 and 147-1 are coupled to the input terminals of corresponding full transmission gates 166-1 and 167-1, coupling column line 66-1 to the drain of pull-up PFET 156-1 through pre-charge line 76-1, and coupling column line 67-1 to the drain of pull-up PFET 157-1 through pre-charge line 77-1, respectively.

In contrast, the outputs of address gate 146-2 and address gate 147-2 are both low. The inputs to full transmission gates 166-2 and 167-2 are low, so that column line 66-2 is not coupled to the drain of pull-up PFET 156-2 through pre-charge line 76-2, and column line 67-2 is not coupled to the drain of pull-up PFET 157-2 through pre-charge line 77-2, respectively.

A pre-charge signal is then asserted low to the gate of each pull-up PFET 156-1, 156-2, 157-1, and 157-2, turning on each transistor and coupling pre-charge lines 76-1, 76-2, 77-1, and 77-2 to source voltage supply $V_{DD}$ through the drain of each transistor. At this point, and all four input terminals 346-1, 346-2, 347-1, and 347-2 to AND gates 326 and 327 are high. However, only column lines 66-1 and 67-1 are pre-charged high, since column lines 66-2 and 67-2 are not coupled to pre-charge lines 76-1 and 77-2. The precharge signal is then asserted high, turning off the pull-up transistors and de-coupling $V_{DD}$ from pre-charge lines 76-1, 76-2, 77-1, and 77-2.

Next, address bus 25 sends a signal to row lines 56-1 and 57-1, bringing the voltage of those row lines high, according to well-known methods. Since memory cell $E_{11}$ is programmed as a logical 1, the voltage of column line 66-1 stays high, as does the voltage of pre-charge line 76-1, which is coupled to column line 66-1 throughout the read operation. Therefore, both inputs to AND gate 326 are high, and bit output 356 is high. However, since memory cell $F_{11}$ is programmed as a logical 0, the voltage of column line 67-1 is discharged to ground, as is the voltage of pre-charge line 77-1, which remains coupled to column line 67-1 throughout the read operation. Therefore, input 347-1 to AND gate 327 is low, while input 347-2 remains high. As a result, bit output 357 is low. Bit outputs 356 and 357 are input to output bus 35. Subsequently, the process may then be repeated to read other words stored in memory system 500.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A read-only memory system, comprising:
   a plurality of memory cells arranged in rows and columns;
   a plurality of column lines, each coupled to a corresponding column of memory cells, said plurality of column lines including a first column line;
   a plurality of row lines, each coupled to a corresponding row of memory cells;
   a plurality of switches including a first switch, said first switch comprising a control terminal, said first switch being operable to couple said first column line to a first pre-charge line;
   a plurality of address systems including a first address system, said first address system having an output terminal coupled to said control terminal of said first switch, said first address system providing a control signal on said output terminal; and
   a plurality of pre-charge systems, including a first pre-charge system, said first pre-charge system coupled to said first pre-charge line, said first pre-charge system configured to provide a pre-charge voltage to said first pre-charge line.

2. The read-only memory system of claim 1, wherein said output terminal of said first address system is directly connected to said input terminal of said first switch.

3. The read-only memory system of claim 2, wherein said first address system comprises a first address gate.

4. The memory system of claim 1, wherein said first switch comprises a full transmission gate.

5. The memory system of claim 4, wherein said full transmission gate couples said first column line to said first pre-charge line when said control signal is high.

6. The memory system of claim 1, wherein each of said plurality of memory cells comprises a transistor.

7. The memory system of claim 6, wherein the drain of said transistor is connected to the corresponding column line, the source of said transistor is connected to ground, and the gate of said transistor is connected to the corresponding row line for each of said plurality of memory cells whose bit value is 0.

8. The memory system of claim 6, wherein the drain of said transistor is not connected to the corresponding column line, the source of said transistor is connected to ground, and the gate of said transistor is connected to the corresponding row line for each of said plurality of memory cells whose bit value is 1.

9. The memory system of claim 1, further comprising a multiplexer comprising a plurality of input terminals including a first input terminal, wherein said first input terminal is connected to said first pre-charge line.

10. The memory system of claim 9, wherein said multiplexer further comprises one or more output terminals.

11. The memory system of claim 9, wherein said multiplexer comprises an AND gate.

12. The memory system of claim 10, further comprising an output bus, wherein said one or more output terminals of said multiplexer are coupled to corresponding input terminals of said output bus.

* * * * *